US012207517B2

(12) United States Patent
Liu et al.

(10) Patent No.: US 12,207,517 B2
(45) Date of Patent: Jan. 21, 2025

(54) PIXEL ARRANGEMENT STRUCTURE, DISPLAY PANEL, AND DISPLAY DEVICE

(71) Applicant: Kunshan Go-Visionox Opto-Electronics Co., Ltd., Kushan (CN)

(72) Inventors: Mingxing Liu, Kunshan (CN); Chao Chi Peng, Kunshan (CN); Zeming Yang, Kunshan (CN); Tian Ma, Kunshan (CN); Dong Zhao, Kunshan (CN); Shuaiyan Gan, Kunshan (CN)

(73) Assignee: Kunshan Go-Visionox Opto-Electronics Co., Ltd., Kushan (CN)

( * ) Notice: Subject to any disclaimer, the term of this patent is extended or adjusted under 35 U.S.C. 154(b) by 418 days.

(21) Appl. No.: 17/697,696

(22) Filed: Mar. 17, 2022

(65) Prior Publication Data

US 2022/0208891 A1 Jun. 30, 2022

Related U.S. Application Data

(63) Continuation of application No. PCT/CN2021/074460, filed on Jan. 29, 2021.

(30) Foreign Application Priority Data

Mar. 11, 2020 (CN) .......................... 202010167886.4

(51) Int. Cl.
H10K 59/35 (2023.01)
(52) U.S. Cl.
CPC .................................. *H10K 59/353* (2023.02)
(58) Field of Classification Search
None
See application file for complete search history.

(56) References Cited

U.S. PATENT DOCUMENTS 9,818,803 B2 11/2017 Lee
10,224,380 B2 3/2019 Hsu et al.
(Continued)

FOREIGN PATENT DOCUMENTS

CN 104050889 B * 4/2015 ............. G02B 5/201
CN 107887404 A 4/2018
(Continued)

OTHER PUBLICATIONS

International Search Report and Written Opinion (International Application No. PCT/CN2021/074460) with English Translation, dated Apr. 2, 2021, 11 pages.
(Continued)

*Primary Examiner* — Michael Lebentritt
(74) *Attorney, Agent, or Firm* — Quarles & Brady LLP

(57) ABSTRACT

A pixel arrangement structure includes two first sub-pixels and two second sub-pixels which are connected as a first virtual quadrilateral. The two first sub-pixels are located at two first vertices of the first virtual quadrilateral. The two second sub-pixels are located at two second vertices of the first virtual quadrilateral. The two first vertices and the two second vertices are alternately arranged and spaced apart from each other. A third sub-pixel is located within the first virtual quadrilateral, and a center of the third sub-pixel deviates from a center of the first virtual quadrilateral. In a row direction or a column direction, the first virtual quadrilateral includes a first side and a second side facing to each other, and a length of the first side is smaller than a length of the second side.

19 Claims, 7 Drawing Sheets

(56) References Cited

U.S. PATENT DOCUMENTS

| | | | |
|---|---|---|---|
| 2007/0085863 A1* | 4/2007 | Moriya | G09G 3/3607 |
| | | | 345/694 |
| 2016/0240593 A1 | 8/2016 | Gu et al. | |
| 2019/0252469 A1 | 8/2019 | Xiao et al. | |
| 2020/0043990 A1 | 2/2020 | Huangfu et al. | |
| 2020/0402442 A1 | 12/2020 | Liu et al. | |
| 2021/0249483 A1* | 8/2021 | Li | |
| 2022/0208890 A1* | 6/2022 | Liu | H10K 59/131 |
| 2023/0058293 A1* | 2/2023 | Liu | H10K 59/351 |
| 2023/0071258 A1* | 3/2023 | Liu | H10K 59/352 |

FOREIGN PATENT DOCUMENTS

| | | | | |
|---|---|---|---|---|
| CN | 207781594 U | * | 8/2018 | |
| CN | 108492723 A | | 9/2018 | |
| CN | 105206647 B | | 10/2018 | |
| CN | 109427855 A | * | 3/2019 | H01L 27/3211 |
| CN | 106960863 B | * | 6/2019 | H01L 27/3211 |
| CN | 109860237 A | * | 6/2019 | G09G 3/2003 |
| CN | 109904200 A | | 6/2019 | |
| CN | 110137206 A | | 8/2019 | |
| CN | 110137207 A | | 8/2019 | |
| CN | 111341817 A | | 6/2020 | |
| WO | WO-2020258797 A1 | * | 12/2020 | H01L 27/3244 |

OTHER PUBLICATIONS

Chinese First Office Action 100191 (CN Application No. 202010167886.4) and Search Result with English Translation, dated Apr. 26, 2021, 17 pages.

* cited by examiner

PIXEL ARRANGEMENT STRUCTURE, DISPLAY PANEL, AND DISPLAY DEVICE

CROSS-REFERENCE TO RELATED APPLICATION

This application is a continuation to international patent application PCT/CN2021/074460, filed on Jan. 29, 2021, which claims priority to Chinese Patent Application No. 202010167886.4, filed on Mar. 11, 2020, the contents of both applications are hereby incorporated by reference in their entireties.

TECHNICAL FIELD

The present disclosure relates to the field of display technology.

BACKGROUND

With the continuous development of display technology, there is an increasing requirement for the resolution of the display panel. The high-resolution display panel continuously expands its application range due to the advantages such as high display quality.

SUMMARY

The present disclosure provides a pixel arrangement structure, a display panel, and a display device.

Generally, using a vapor deposition technique, an organic material is deposited through a fine mask to form an organic electroluminescent structure at a corresponding sub-pixel position on an array substrate. However, in order to obtain a high pixel aperture ratio, a distance between adjacent sub-pixels needs to be reduced, which increases the difficulty in manufacturing the mask and reduces the reliability of the deposition. In contrast, the pixel aperture ratio will be sacrificed when increasing the distance between sub-pixels to improve deposition reliability.

According to one aspect of the present disclosure, a pixel arrangement structure is provided, which includes:
- two first sub-pixels and two second sub-pixels, wherein the two first sub-pixels and the two second sub-pixels are connected as a first virtual quadrilateral, the two first sub-pixels are respectively located at two first vertices of the first virtual quadrilateral, the two second sub-pixels are respectively located at two second vertices of the first virtual quadrilateral, wherein the two first vertices and the two second vertices are alternately arranged and spaced apart from each other; and
- a third sub-pixel located within the first virtual quadrilateral, wherein a center of the third sub-pixel deviates from a center of the first virtual quadrilateral.

In a row direction or a column direction, the first virtual quadrilateral includes a first side and a second side facing to each other, and a length of the first side is smaller than a length of the second side.

In the first virtual quadrilateral, a distance between one of the two first sub-pixels located on the second side and the third sub-pixel is greater than a distance between the other one of the two first sub-pixels located on the first side and the third sub-pixel.

In the aforementioned pixel arrangement structure compared with other arrangement forms when the manufacturing conditions are the same, so that an available distance between the adjacent pixel apertures is enlarged, which is conducive to transfer the mesh tensioning force, which reduces the deformation of the mask, and reduces the difficulty of the manufacture process of the fine metal mask, and reduces the difficulty of the vapor deposition process.

According to another aspect of the present disclosure, a display panel is provided, which includes the aforementioned pixel arrangement structure.

According to still another aspect of the present disclosure, a display device is provided, which includes the aforementioned display panel.

BRIEF DESCRIPTION OF THE DRAWINGS

In order to illustrate the embodiments of the present disclosure more clearly, the drawings used in the embodiments will be described briefly. The following described drawings are merely for the embodiments of the present disclosure, and other drawings can be derived by those of ordinary skill in the art without any creative effort.

DETAILED DESCRIPTION

The present disclosure is described in detail with reference to the accompanying drawings and embodiments in order to make the objects, technical solutions, and advantages of the present disclosure clearer. It should be understood that the specific embodiments described herein are only for explaining the present disclosure, and not intended to limit the present disclosure.

There are many colorization methods of OLED display panels at present, wherein the OLED vapor deposition technique is a mature OLED colorization technology used for mass production. Specifically, the OLED vapor deposition technique is a vapor deposition technique by which organic light-emitting elements are formed at corresponding sub-pixel positions on an array substrate via a fine metal mask (FMM). The fine metal mask is also referred to as a vapor deposition mask. The technical points of the manufacture of OLED display panel with a high PPI (Pixel Per Inch, the number of pixels per inch) are the FMM with high precision and good mechanical stability and the arrangement form of the pixels.

Figure 1:
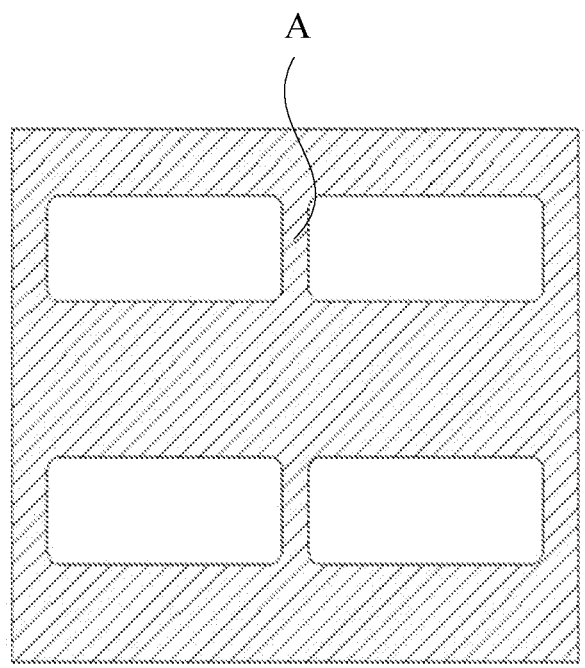
FIG. 1 is a schematic view of a mask according to the prior art.

Specifically, problems in FMM such as curve and fracture should be minimized to avoid defects such as blurring and offset of the vapor deposited film, the defects will affect the quality of vapor deposition. The arrangement form of the pixels is the main factor for determining whether the FMM is prone to curve and fracture. That is, the arrangement form of the sub-pixels determines the mechanical performance of the FMM to a large extent, and the mechanical performance of the FMM determines the quality of vapor deposition to a large extent. For example, as shown in FIG. 1, if a distance between two sub-pixels is too small, a connecting portion A between two vapor deposition apertures in the corresponding FMM may be at risk of fracture due to its too small width and the space for alignment between the FMM and the sub-pixel region of the display panel will also be reduced. This may cause defects of color missing or color mixing in the formed sub-pixels. If the width of the connecting portion A is increased, the size of the sub-pixels needs to be reduced, thereby affecting the pixel aperture ratio of the OLED display panel, which is not conducive to achieve a high resolution. Therefore, in the current OLED display device, the distance between the sub-pixels of the pixel arrangement structure is relatively large, which results in a small aperture area of the sub-pixels under the condition of the same resolution. Accordingly, the drive current needs to be increased to satisfy the display brightness requirement. However, when the OLED display device is operated under a large drive current, the device is prone to aging, thus occurring a phenomenon of color shift at a large viewing angle, which shortens the service life of the OLED display device.

In addition, in order to achieve more functions of terminal equipment, a photosensitive device is usually installed under the display panel. For example, a fingerprint identification device can be installed under the display panel. The photosensitive device used to acquire a fingerprint image can include an optical sensor. The optical sensor may include a plurality of pixels, and the plurality of pixels can respectively receive incident lights formed by light signals reflected from different positions of an object, and convert the incident lights into electrical signals, thereby generating an image of the object. Therefore, the amount of the input lights and the contrast of the light signals received by the pixels will affect the quality of the generated object image. Accordingly, the light transmittance of the display panel has to meet certain criteria, which further increases the difficulty in design of the pixel arrangement structure.

Embodiments of the present disclosure provide a pixel arrangement structure, a display panel, and a display device, which can better alleviate the aforementioned problems.

Figure 2:
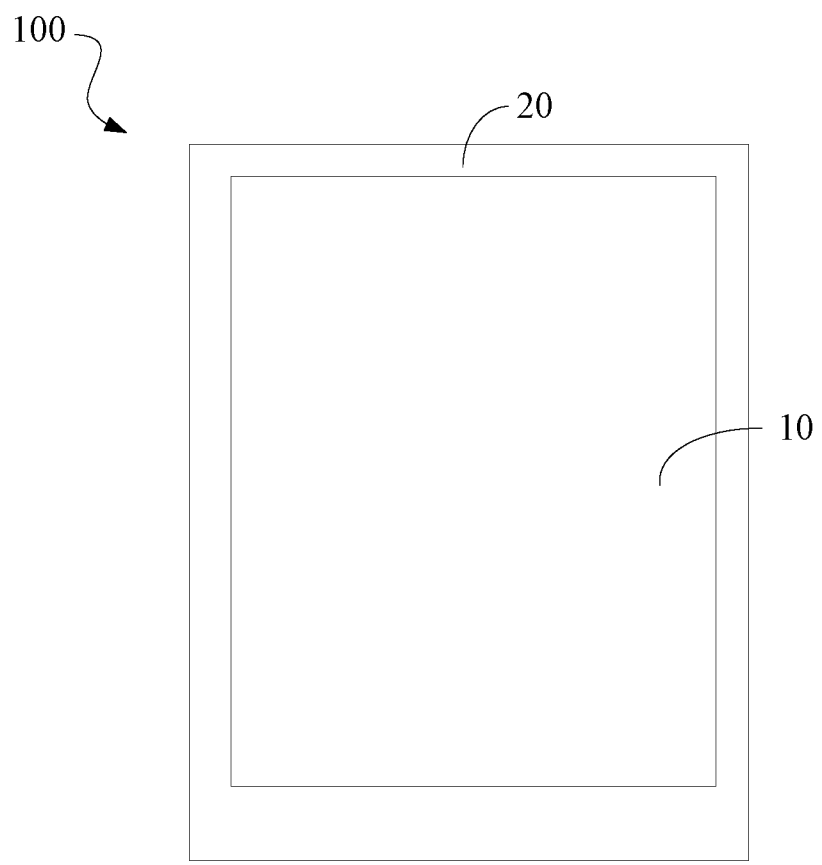
FIG. 2 is a schematic view of a display panel according to an embodiment of the present disclosure.
Figure 4:
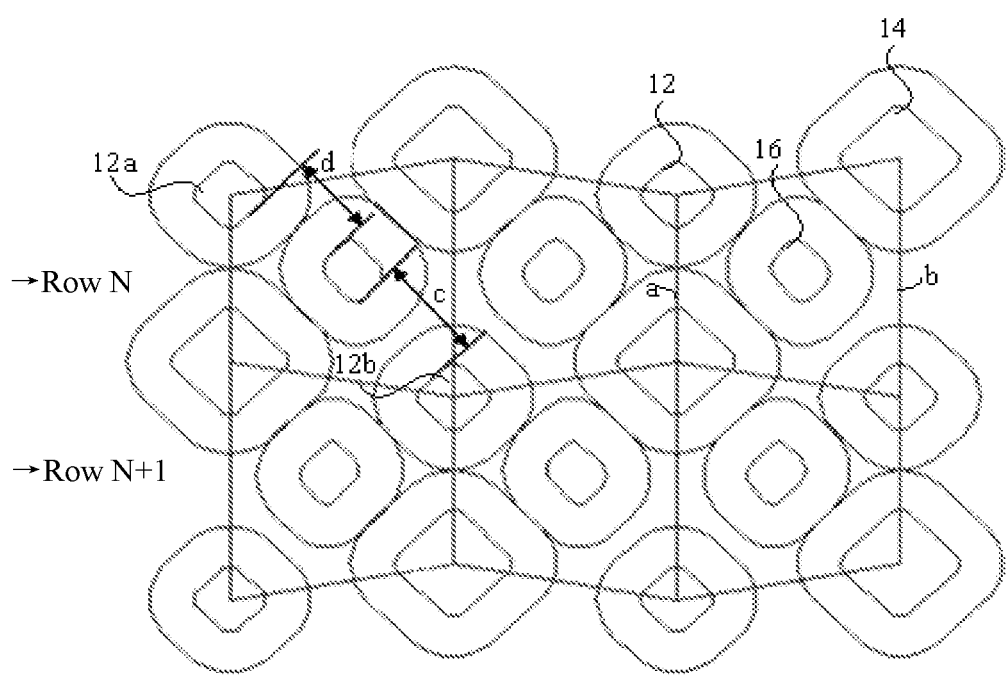
FIG. 4 is a schematic view of a pixel arrangement according to an embodiment of the present disclosure.

Referring to FIG. 2, the display panel 100 includes a display region 10 and a non-display region 20. The display region 10 displays an image through a plurality of sub-pixels. In an embodiment, the display region 10 can be rectangular, and the non-display region 20 is arranged around the display region 10. Of course, the shape and arrangement of the display region 10 and the non-display region 20 are not limited to this embodiment. For example, when the display panel 100 is used in a wearable device, the display region 10 may have a round shape like a watch dial. When the display panel 100 is in a vehicle, the display region 10 and the non-display region 20 may have round, polygonal or other shapes. The display region 10 is provided with a plurality of sub-pixels configured to emit lights of different colors, and the sub-pixels are defined as the smallest member configured to emit lights (for example, the smallest addressable member of the display panel 100). Referring to FIG. 4, in an embodiment, the pixel arrangement structure includes first sub-pixels 12, second sub-pixels 14, and third sub-pixels 16 which respectively emit lights of different colors. The first sub-pixel 12, the second sub-pixel 14, and the third sub-pixel 16 each can be one of a red sub-pixel, a blue sub-pixel, and a green sub-pixel, and cooperatively constitute a pixel capable of emitting white light. In some other embodiments, the first sub-pixel 12, the second sub-pixel 14, and the third sub-pixel 16 may emit colors other than red, green, and blue, which are not limited herein.

Figure 3:
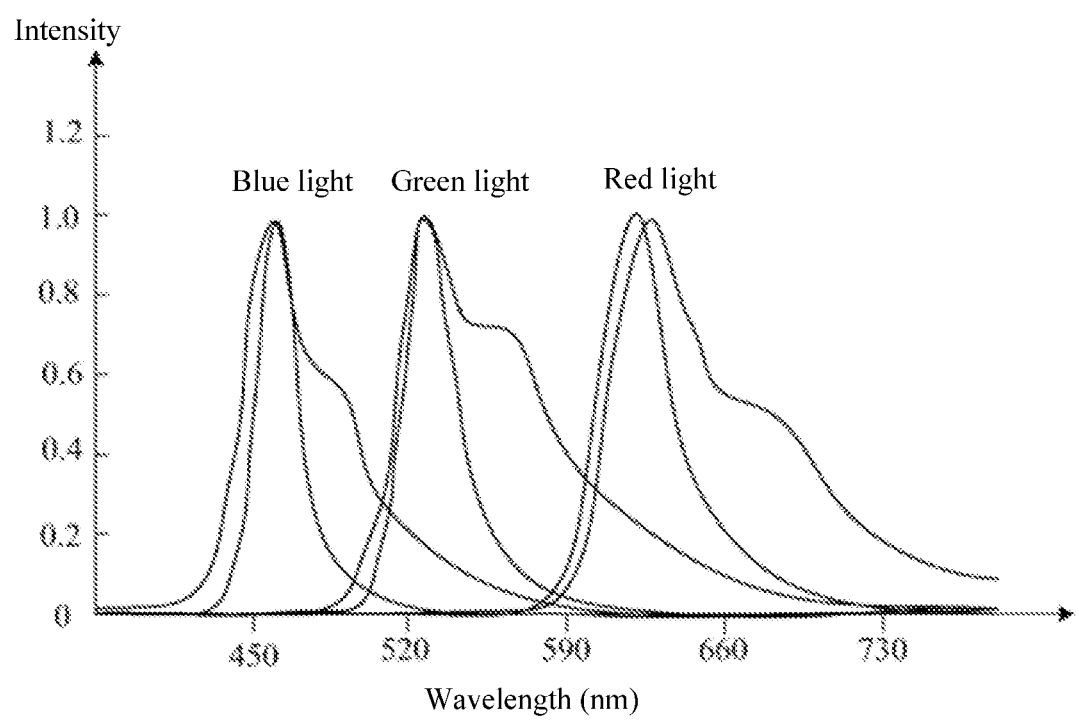
FIG. 3 is a graph showing spectra of blue light, green light, and blue light.

Lights with different colors have different wavelengths. The greater the wavelength, the larger the energy of the light. Light with larger energy is more likely to cause the decay of the organic light-emitting material, so that the sub-pixels emitting photons with larger energy are more likely to attenuate. In the spectrum graph shown in FIG. 3, the horizontal axis is the wavelength in unit of nanometer, and the vertical axis is the light intensity. As the wavelength of the blue light is shorter than the wavelength of the red light and the wavelength of the green light, the energy of blue light is larger, and the organic light-emitting material emitting blue light is more likely to decay, so that the light emitted from the pixel unit is prone to be reddish, resulting in color shift of white light. In addition, since the light emitted by each sub-pixel is repeatedly reflected and re-reflected between the anode and the cathode via the microcavity effect, an amplification and a constructive interference are performed on the light, the brightness of the light increases, and thus the color shift is further amplified.

As shown in FIG. 4, a light-emitting area (i.e., a pixel aperture area) of a blue sub-pixel (e.g., the second sub-pixel 14) is greater than a light-emitting area of a red sub-pixel (e.g., the first sub-pixel 12) and also greater than a light-emitting area of a green sub-pixel (e.g., the third sub-pixel 16). Accordingly, display defects caused by different attenuation rates of the organic light-emitting materials emitting lights of different colors can be reduced to a certain extent.

Since human eyes are more sensitive to green light, in some embodiments, the light-emitting area of the green sub-pixel is smaller than the light-emitting area of the red sub-pixel. In other embodiments, the light-emitting area of the green sub-pixel can be equal to the light-emitting area of the red sub-pixel, which is not limited herein.

The display panel 100 provided by each exemplary embodiment of the present disclosure can be an organic light emitting display panel 100. The sub-pixel at least includes an anode, a cathode, and a light-emitting layer located between the anode and the cathode. A driving circuit applies a voltage between the anode and the cathode to excite carrier migration in the light-emitting layer to emit light.

Specifically, the light-emitting layer at least includes a hole transport layer, an organic material layer, and an electron transport layer. The anode is configured to transport holes or provide holes to the hole transport layer. The cathode is configured to provide electrons or transport electrons to the organic material layer. In some embodiments, the display panel 100 can further include a pixel definition layer. The pixel definition layer defines a plurality of pixel apertures. The light-emitting layer of the sub-pixel is arranged in the pixel aperture to avoid color pollution or interference between adjacent sub-pixels. For example, in the embodiments shown in FIGS. 4 and 5, the first sub-pixels 12, the second sub-pixels 14, and the third sub-pixels 16 all have a shape of rectangle, and the rectangle include an inner rectangle and an outer rectangle surrounding the inner rectangle. Sides of the inner rectangles are called pixel sides, that is, boundaries or edges of the pixel apertures of the pixel definition layer (PDL). Sides of the outer rectangles are called virtual sides of the sub-pixels. The virtual sides form outer boundaries or edges of the sub-pixels when the mask is arranged on the display panel 100. A distance between the sub-pixels refers to the minimum distance between adjacent pixel sides of the sub-pixels. For example, as shown in FIG.

4, a distance between the first sub-pixel 12a and the third sub-pixel 16 is the minimum distance between the pixel sides of the two sub-pixels.

In an embodiment, each pixel side and the corresponding virtual side of each sub-pixel are parallel to each other, and the vertical distance between the pixel side and the corresponding virtual side of each sub-pixel is the same. Thereupon, the arrangement of the sub-pixels can be more uniform and ordered, thereby effectively improving the accuracy and yield in manufacture of the light-emitting layers of the sub-pixels, and reducing the risk of wrinkles when stretching the mask.

In some other embodiments, the first sub-pixels 12, the second sub-pixels 14, and the third sub-pixels 16 can have other shapes, for example, a quadrilateral, a hexagon, an octagon, or a quadrilateral with rounded corners, a hexagon with rounded corners, or an octagon with rounded corners, and are not limited herein.

In each exemplary embodiment of the present disclosure, two first sub-pixels 12 and two second sub-pixels 14 are connected as a first virtual quadrilateral, the first sub-pixels 12 are located at the position of two first vertices of the first virtual quadrilateral, the second sub-pixels 14 are located at the position of two second vertices of the first virtual quadrilateral, and the first vertices and the second vertices are alternately arranged and spaced apart from each other. That is, the two first sub-pixels 12 are respectively located at a pair of opposite corners of the first virtual quadrilateral, and the two second sub-pixels 14 are respectively located at the other pair of opposite corners of the first virtual quadrilateral. The third sub-pixel 16 is located within the first virtual quadrilateral, i.e., surrounded by the two first sub-pixels 12 and the two second sub-pixels 14. Accordingly, on one hand, the arrangement of the sub-pixels can be more compact, and the aperture ratio of each sub-pixel can be increased. On the other hand, in some embodiments, the sub-pixels with human eye-sensitivity to color can be placed inside the first virtual quadrilateral to prevent color shift. For example, when red light, green light, and blue light are mixed to form white light, the white light can be mixed by approximately 30% red light, 60% green light, and 10% blue light. Compared with other arrangements, when the third sub-pixel 16 is a green sub-pixel, the color mixing can be more uniform, and the color shift can be better alleviated.

A certain position at which sub-pixel is located refers to a position range of the sub-pixel, as long as the sub-pixel overlaps the position. For example, in some embodiments, the center of the first sub-pixel or the second sub-pixel may not coincide with the vertex of the first virtual quadrilateral, that is, there is an offset between the vertex of the first virtual quadrilateral and the center of the first sub-pixel or the second sub-pixel. However, in order to ensure that the sub-pixels can be evenly distributed as much as possible, in an embodiment, the first sub-pixel 12 can have a center which coincides with the first vertex of the first virtual quadrilateral, and the second sub-pixel 14 may have a center which coincides with the second vertex of the first virtual quadrilateral. The center of the sub-pixel can be the geometric center of the shape of the sub-pixel or the center of the light-emitting color of the sub-pixel, which is not limited herein.

In some embodiments, the pixel arrangement structure includes a plurality of first virtual quadrilaterals. The plurality of first virtual quadrilaterals are arranged to form an array in a manner of sharing sides; that is, two adjacent pixel groups share the first sub-pixel 12 and the second sub-pixel 14 located on the adjacent sides of the first virtual quadrilaterals. More specifically, the first sub-pixel 12 located at the position of the first vertex of the first virtual quadrilateral and the second sub-pixel 14 located at the position of the second vertex of the first virtual quadrilateral are shared by one to four first virtual quadrilaterals. For example, in the embodiment shown in FIG. 4, in the array, a plurality of first virtual quadrilaterals in the Nth row and a plurality of first virtual quadrilaterals in the (N+1)th row are engaged with each other, and the arrangement of the first virtual quadrilaterals in Nth row is the same as the arrangement of the first virtual quadrilaterals in the (N+2)th row, where N≥1. Accordingly, during display, any adjacent first sub-pixel 12 and second sub-pixel 14 can form a light-emitting pixel with the third sub-pixel 16 adjacent to them. The pixels can borrow colors from each other thereby achieving a high-resolution display effect from low physical resolution.

In each exemplary embodiment of the present disclosure, along the row direction or the column direction, the first virtual quadrilateral has a first side a and a second side b which are facing to each other and have different lengths. The length of the first side a is smaller than the length of the second side b.

In the embodiment shown in FIG. 4, the first virtual quadrilateral has four vertices, and the centers of the two first sub-pixels 12 respectively coincide with the two opposite vertices (i.e., the first vertices) of the first virtual quadrilateral. The centers of the two second sub-pixels 14 respectively coincide with the other two opposite vertices (i.e., the second vertices) of the first virtual quadrilateral. The first side a and the second side b are two sides each taking the first vertex and the second vertex as the endpoints. In the row direction, the first side a is a side with a smaller length, and the second side b is a side with a greater length. Correspondingly, the distance between the first sub-pixel 12 and the second sub-pixel 14 located on the first side a is relatively small, and the virtual sides of the two sub-pixels abut against each other. The distance between the first sub-pixel 12 and the second sub-pixel 14 located on the second side b is relatively large, and the virtual sides of the two sub-pixels are spaced apart from each other. When the first virtual quadrilateral has a shape of square, the distance between the first sub-pixel 12 and any adjacent second sub-pixel 14 is equal. In this way, although the arrangement of the sub-pixels is uniform, the pixel aperture ratio, which is limited by the difference in size of the light-emitting areas of different sub-pixels and by photolithography technique, is low. In contrast, when the first side a and the second side b facing to each other in the first virtual quadrilateral has different lengths, the sub-pixel arrangement can be more compact by adjusting the positions of the first sub-pixels 12, the second sub-pixels 14 and the third sub-pixel 16. If only allowed by the photolithography technique, the distance between adjacent sub-pixels can be reduced, thereby increasing the aperture ratio of the sub-pixels.

Figure 5:
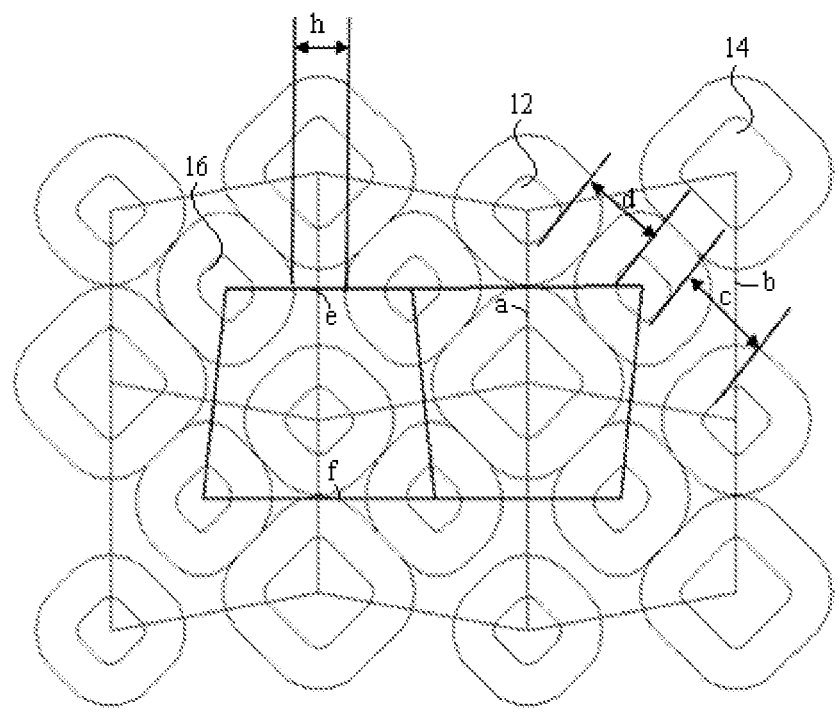
FIG. 5 is a schematic view of a pixel arrangement according to another embodiment of the present disclosure.

As an optional embodiment, the first side a and the second side b can be parallel to each other. As shown in FIGS. 4 and 5, in the row direction, every two adjacent first virtual quadrilaterals are arranged symmetrically about the first side a or the second side b as the axis of symmetry. Accordingly, the arrangement of the sub-pixels can be more ordered, the display effect can be improved, and the sub-pixels of the same color can be arranged in a row or a column, which reduces the difficulty in arranging wires and the manufacture difficulty of the mask.

In each exemplary embodiment of the present disclosure, a center of the third sub-pixel 16 deviates from the center of the first virtual quadrilateral. The distance between the first sub-pixel 12 located on the second side b and the third sub-pixel 16 is greater than the distance between the first sub-pixel 12 located on the first side a and the third sub-pixel 16. It can be understood that the center of the first virtual quadrilateral can be the intersection of the two diagonal lines of the first virtual quadrilateral. When the manufacture conditions are the same, in the aforementioned pixel arrangement structure, the distance between the third sub-pixels 16 respectively located in the two adjacent first virtual quadrilaterals sharing the second side b can be increased compared with other arrangement forms. Therefore, an available distance between the adjacent pixel apertures is enlarged, which is conducive to transfer the force of stretching the mask, reduces the deformation of the mask, and reduces the difficulty of the manufacture process of the fine metal mask and the vapor deposition process.

Specifically, as shown in FIGS. 4 and 5, the center of the third sub-pixel 16 deviates from the center of the corresponding first virtual quadrilateral. The distance between the third sub-pixel 16 and one of the first sub-pixels 12a of the corresponding first virtual quadrilateral is c, and the distance between the third sub-pixel 16 and the other first sub-pixel 12b is d, where c>d. The minimum distance h between the virtual sides of the third sub-pixel 16 in the two first virtual quadrilaterals sharing the second side b is larger compared to that in other pixel arrangements, thereby ensuring the aperture ratio of the third sub-pixels 16, and reducing the manufacture difficulty of the mask for the third sub-pixels 16.

The amount of input lights and the contrast of the light signals received by the photosensitive device under the display panel will affect the imaging quality of the photosensitive device. Therefore, although a lot of light-transmitting regions exist in a display panel with a traditional pixel arrangement structure to achieve substantially the same total light-transmitting area, an area of a continuous light-transmitting region in a specific location is small, which cannot meet the light transmittance criteria for normal operation of the photosensitive device under the display panel. In the exemplary embodiments of the present disclosure, in the first virtual quadrilateral, the distance between one of the two first sub-pixels 12 and the third sub-pixel 16 is not equal to the distance between the other one of the two first sub-pixels 12 and the third sub-pixel 16, and thus an area of a continuous light-transmitting region can be increased, thereby increasing the light transmittance of the display panel 100, which is conducive to the functional diversification of the display panel 100. For example, in the embodiment shown in FIGS. 4 and 5, the virtual sides of the two third sub-pixels 16 in two adjacent first virtual quadrilaterals and the virtual sides of the first sub-pixel 12 and the second sub-pixel 14 shared by the two first virtual quadrilaterals cooperatively form a light-transmitting region. The light-transmitting regions formed by the virtual sides of the sub-pixels in a plurality of adjacent first virtual quadrilaterals can be connected to form a large light-transmitting region, thereby effectively increasing the light transmittance of the display panel 100.

In some embodiments, in the first virtual quadrilateral, the distance between the center of the third sub-pixel 16 and the center of any first sub-pixel 12 is not equal to the distance between the center of the third sub-pixel 16 and the center of any second sub-pixel 14. Increasing a light-emitting area of the sub-pixel which decays faster can alleviate the color shift. However, if simply increasing the light-emitting area of the sub-pixels, not changing the pixel arrangement, the distance between the sub-pixels will be reduced, and the aperture ratio of the sub-pixels will be reduced. In this embodiment, the distance between the center of the third sub-pixel 16 and the center of any first sub-pixel 12 is not equal to the distance between the center of the third sub-pixel 16 and the center of any second sub-pixel 14. In this way, the first sub-pixels 12, the second sub-pixels 14 and the third sub-pixel 16 can be closely arranged, so that the light-emitting area of the sub-pixel can be increased under the same resolution. For example, the distance between the center of the third sub-pixel 16 and the center of any first sub-pixel 12 is smaller than the distance between the center of the third sub-pixel 16 and the center of any second sub-pixel 14, so that the first sub-pixel 12, the second sub-pixel 14, and the third sub-pixel 16 can be closely arranged, and thus a light-emitting area of the second sub-pixel 14 can be increased under the same resolution.

As an optional embodiment, the distance between the center of the third sub-pixel 16 and the center of one of the two second sub-pixels 14 can be equal or unequal to the distance between the center of the third sub-pixel 16 and the center of the other one of the two second sub-pixels 14, which is not limited herein.

In some embodiments, in the first virtual quadrilateral, the distance between one first sub-pixel 12 and any adjacent second sub-pixel 14 is not equal to the distance between the other first sub-pixel 12 and any adjacent second sub-pixel 14. In this way, the arrangement of the sub-pixels can be more compact, and there is sufficient space to adjust the position of the third sub-pixel 16 to differentiate the distances respectively between the two first sub-pixels 12 and the third sub-pixel 16, thereby increasing the distances between the shared second side b and the two third sub-pixels 16, which is conducive to reduce the manufacture difficulty of the mask. For example, in some embodiments, in the first virtual quadrilateral, the distances respectively between the first sub-pixel 12a and the two adjacent second sub-pixels 14 are all smaller than the distances respectively between the first sub-pixel 12b and the two adjacent second sub-pixels 14. As shown in FIGS. 4 and 5, the virtual side of the first sub-pixel 12a can abut against the virtual side of one of the adjacent second sub-pixels 14 and spaced apart from the virtual side of the other adjacent second sub-pixel 14 for a preset distance, so as to increase the distance between the first sub-pixel 12a and the other adjacent second sub-pixel 14, which is conducive to increase the aperture ratio of the sub-pixels. In addition, since the other first sub-pixel 12b is far away from the two adjacent second sub-pixels 14, the positions of the third sub-pixels 16 can be adjusted to increase the distance between the two third sub-pixels 16 on two sides of the second side b while ensuring the pixel aperture ratio, thereby reducing the manufacture difficulty of the mask.

In some other embodiments, the distances respectively between the first sub-pixel 12a and the two adjacent second sub-pixels 14 can be equal or unequal to each other, and the distances respectively between the first sub-pixel 12b and the two adjacent second sub-pixels 14 can be equal or unequal to each other. That is, in the first virtual quadrilateral, the distances respectively between any first sub-pixel 12 and the two adjacent second sub-pixels 14 cannot be equal to each other to each other. Similarly, the aforementioned distances can be set reasonably according to needs, so as to reduce the manufacture difficulty of the mask while ensuring the pixel aperture ratio.

In some embodiments, in two opposite inner angles of the first virtual quadrilateral, one inner angle is smaller than 90°, and the other inner angle is greater than 90°. As shown in FIGS. 4 and 5, in the first virtual quadrilateral, the first side a is parallel to the second side b. In the two inner angles of the first virtual quadrilateral corresponding to the two first sub-pixels 12, one inner angle is smaller than 90°, and the other inner angle is greater than 90°. In the two inner angles of the first virtual quadrilateral corresponding to the two second sub-pixels 14, one inner angle is smaller than 90°, and the other inner angle is greater than 90°. Accordingly, under the same manufacture conditions, the arrangement of the first sub-pixels 12, the second sub-pixels 14 and the third sub-pixel 16 is more compact compared with other arrangements (for example, the two opposite inner angles are both smaller than 90° or both greater than 90°), thereby effectively increasing the aperture ratio of the sub-pixels.

Of course, in other embodiments, in the first virtual quadrilateral, the first side a and the second side b can be non-parallel, and a pair of inner angles can be equal to 90°, one inner angle of the other pair of inner angles can be smaller than 90°, and the other inner angle of the other pair of inner angles can be greater than 90°, which is not limited herein.

In the first virtual quadrilateral, if the length difference between the first side a and the second side b is too large, the difference between the opposite inner angles of the first virtual quadrilateral will be too large, which will cause the arrangement of the sub-pixels to be too loosely and affect the aperture ratio of the sub-pixels.

In an embodiment, the ratio of the length of the first side a to the length of the second side b of the first virtual quadrilateral can range from 0.5 to 0.95. In the embodiment shown in FIG. 4, the length a of the first side a is smaller than the length b of the second side b, and a:b ranges from 0.5 to 0.95. In this way, the sub-pixel arrangement can be made as compact as possible on the premise of meeting the technique limit.

The minimum distance between sub-pixels should meet the technical limit distance. The technical limit distance is related to the manufacture technique used. For example, when the FMM is used in etching to form the sub-pixel pattern, the minimum distance can be about 16 μm; when laser or electroforming technique is used in forming the sub-pixel pattern, the minimum distance can be even smaller.

In each exemplary embodiment of the present disclosure, in the row direction or the column direction, any two first virtual quadrilaterals sharing a first side a or a second side b form a group; the two first virtual quadrilaterals sharing the second side b or the first side a in an adjacent row or column form another group. The four first virtual quadrilaterals in the two groups share a first vertex or a second vertex, and the lines connecting the centers of the four third sub-pixels 16 in the first virtual quadrilaterals of the two groups form a second virtual quadrilateral. For example, in the embodiments shown in FIGS. 4 and 5, in the same first virtual quadrilateral, the first side a is parallel to the second side b. In the row direction, the two first virtual quadrilaterals share the first side a. In an adjacent row, the two first virtual quadrilaterals share the second side b. Lines connecting the centers of the four third sub-pixels 16 in the four first virtual quadrilaterals form a second virtual quadrilateral. In the column direction, the second virtual quadrilateral includes a third side e and a fourth side f facing to each other and unequal in length. With such a design, the arrangement of the first sub-pixel 12, the second sub-pixel 14, and the third sub-pixel 16 can be furthermore compact, which is conducive to increase the aperture area of the sub-pixels and increase the pixel aperture ratio.

As an optional embodiment, the third side e and the fourth side f in the second virtual quadrilateral are parallel to each other. Thereupon, lines connecting the centers of the third sub-pixels 16 in the same row or column can be located in the same straight line, thereby further reducing the difficulty in arranging wires and the manufacture difficulty of the mask. Referring to FIGS. 4 and 5, in the first virtual quadrilateral, the first side a is parallel to the second side b, and in the second virtual quadrilateral, the third side e is parallel to the fourth side f, and the extension directions of the third side e and the fourth side f are perpendicular to the extension directions of the first side a and the second side b. In this way, the arrangement of the sub-pixels is furthermore uniform and ordered, which is conducive to improve the display uniformity and reduce the manufacture difficulty of the mask.

Figure 6:
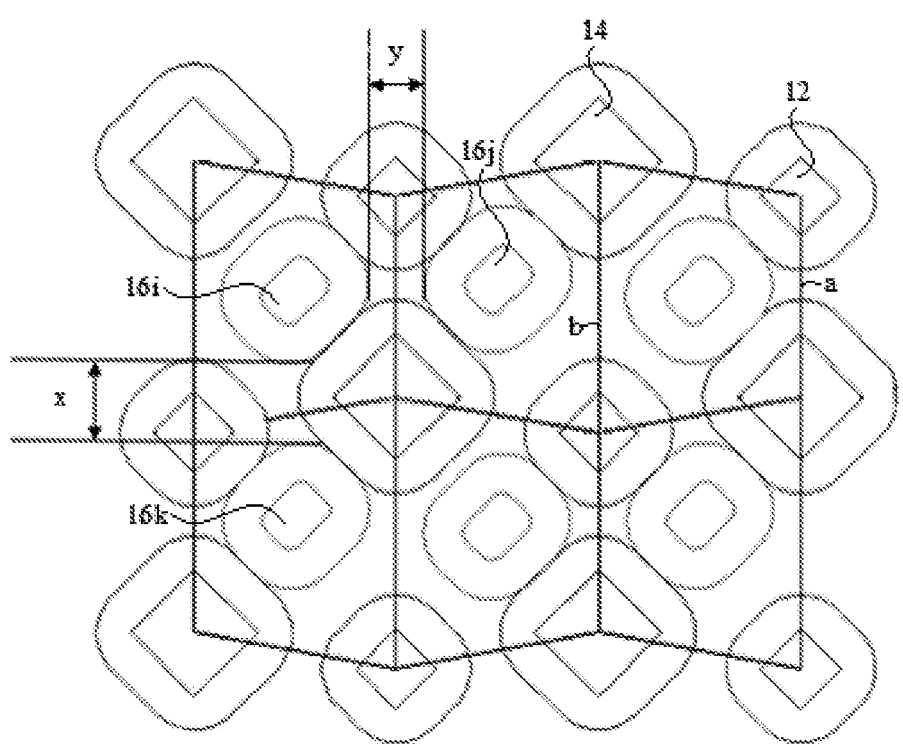
FIG. 6 is a schematic view of a pixel arrangement according to still another embodiment of the present disclosure.

Referring to FIG. 6, in some embodiments of the present disclosure, the third sub-pixel 16 has a shape of rectangle or quasi-rectangle. The length direction of the plurality of third sub-pixels 16 is oblique with respect to the row direction or the column direction. It should be understood that the force applied to the mask is usually transferred in the row direction or the column direction; for example, the force of stretching the mask can be transferred in the row direction. The apertures of the mask, corresponding to the third sub-pixels 16, which is oblique with respect to the row direction or the column direction can decompose the force in the row direction and the column direction, thereby avoiding the deformation of the apertures caused by the concentration of the force of stretching the mask applied to the FMM, and reducing the difficulty in manufacturing and the difficulty in stretching the mask. In addition, when the apertures of the mask are arranged obliquely, the mask with the same length and same width can include more apertures, thereby reducing the manufacturers cost of the mask. In one embodiment, the angle formed between the length direction of the third sub-pixels 16 and the row direction or the column direction is 45° to 135°.

As an optional embodiment, as shown in FIG. 6, along the row direction or the column direction, the minimum distance between the virtual side of any third sub-pixel 16$i$ and the closest virtual side of another third sub-pixel 16$j$ adjacent to the third sub-pixel 16$i$ is a first distance y. In the column direction or the row direction, the minimum distance between the virtual side of the third sub-pixel 16$i$ and the virtual side of still another third sub-pixel 16$k$ adjacent thereto is a second distance x, where y<x. That is to say, since the distances respectively between the first sub-pixels 12 located on the second side b and the third sub-pixel 16 are all greater than the distances respectively between the first sub-pixels 12 on the first side a and the third sub-pixel 16, in the row direction or in the column direction, the distances respectively between any third sub-pixel 16 and two adjacent third sub-pixels 16 are not equal to each other.

In addition, in order to take into account the compactness of the sub-pixels arrangement and the arrangement that the length directions of the third sub-pixels 16 are obliquely arranged in the same direction with respect to the row direction or the column direction, the first distance y can be smaller than the second distance x. For example, in the embodiment shown in FIG. 6, the third sub-pixel 16 has a shape of rectangle, and the extending direction of the sides of the rectangular third sub-pixel 16 is inclined at 45° with respect to the row direction or the column direction. If the third sub-pixels 16 are arranged obliquely in the same direction, and if the distance y between the virtual side of the third sub-pixel 16$i$ and the virtual side of the third sub-pixel 16*j* which is adjacent to the third sub-pixel 16*i* in the row direction remains unchanged, when the distance y is greater than or equal to the distance x between the virtual side of the third sub-pixel 16*i* and the virtual side of the third sub-pixel 16*k* which is adjacent to the third sub-pixel 16*i* in the column direction, the distance between the adjacent first sub-pixel 12 and second sub-pixel 14 in the column direction may need to be reduced. However, this will increase the manufacture difficulty of the apertures in the mask for other sub-pixels, or even exceed the technical limit distance for the mask. Therefore, on the condition that the distance y between the virtual sides of the adjacent third sub-pixels 16 in the same row is smaller than the distance x between the virtual sides of the adjacent third sub-pixels 16 in the same column, the length direction of the third sub-pixels 16 can be obliquely arranged in the same direction while the sub-pixels are more compactly arranged.

The quasi-rectangle refers to that due to manufacture limitations or for the convenience of manufacturing the mask, the shape of the sub-pixel may not be strictly parallelogram or rectangle, but roughly parallelogram or roughly rectangle; for example, a rounded rectangle or a corner-cutting rectangle with rounded corners. A rounded rectangle is a shape formed by rounding the corners of a rectangle, and a corner-cutting rectangle is a shape formed by cutting off one or more corners of a rectangle. The sub-pixels are provided with a shape of quasi-parallelogram or quasi-rectangle, which can adjust the aperture ratio of the sub-pixels more flexibly, and meet the requirements in manufacture of the mask.

Figure 7:
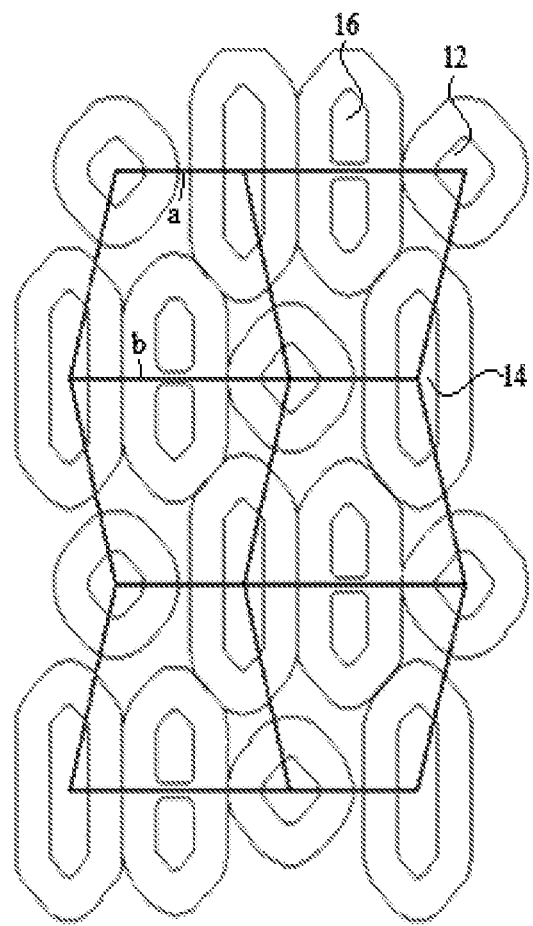
FIG. 7 is a schematic view of a pixel arrangement according to yet another embodiment of the present disclosure.

Referring to FIG. 7, FIG. 7 shows that the two third sub-pixels 16 in any two first virtual quadrilaterals sharing the second side b share one mask aperture. Specifically, as shown in FIG. 7, in the column direction, the third sub-pixels 16 in the two first virtual quadrilaterals sharing the second side b are arranged symmetrically about the second side b as the axis of symmetry, and the distance between the centers of the two third sub-pixels 16 is relatively small. In this way, the third sub-pixels 16 in the two first virtual quadrilaterals sharing the second side b can share one mask aperture. Thereupon, a pixel unit with a smaller size can be manufactured when the technique conditions are met, thereby increasing the PPI of the display panel 100, and further improving the resolution of the display panel 100.

Based on the same inventive concept, each exemplary embodiment of the present disclosure further provides a mask, configured to manufacture the pixel arrangement structure provided by each exemplary embodiment of the present disclosure. The mask includes a plurality of aperture regions corresponding to the shapes and positions of the first sub-pixels 12, the second sub-pixels 14, or the third sub-pixels 16, and mask substantially includes one or more of the corresponding technical features of the pixel arrangement structure in the aforementioned embodiments, which will not be repeated herein.

Based on the same inventive concept, each exemplary embodiment of the present disclosure further provides a display device, which includes the display panel 100 in the aforementioned embodiments. The display panel 100 includes the pixel arrangement structure provided by the exemplary embodiments of the present disclosure, and the pixel arrangement structure substantially includes one or more of the corresponding technical features of the pixel arrangement structure in the aforementioned embodiments, which will not be repeated herein.

Specifically, the display device can be applied to the fields such as mobile phone terminals, bionic electronics, electronic skins, wearable devices, in-vehicle devices, Internet of Things devices, and artificial intelligence devices. For example, the aforementioned display device can be a digital device such as a mobile phone, a tablet, a palmtop computer, an iPod, and a smart watch.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:

1. A pixel arrangement structure, comprising two first sub-pixels and two second sub-pixels; and
    wherein the two first sub-pixels and the two second sub-pixels are connected as a first virtual quadrilateral;
    wherein the two first sub-pixels are respectively located at two first vertices of the first virtual quadrilateral;
    wherein the two second sub-pixels are respectively located at two second vertices of the first virtual quadrilateral;
    wherein the two first vertices and the two second vertices are alternately arranged and spaced apart from each other;
    wherein a third sub-pixel located within the first virtual quadrilateral, a center of the third sub-pixel deviating from a center of the first virtual quadrilateral;
    wherein in a row direction or a column direction, the first virtual quadrilateral comprises a first side and a second side facing to each other, and a length of the first side is smaller than a length of the second side; and
    wherein in the first virtual quadrilateral, a distance between one of the two first sub-pixels located on the second side and the third sub-pixel is greater than a distance between the other one of the two first sub-pixels located on the first side and the third sub-pixel.

2. The pixel arrangement structure according to claim 1, wherein centers of the two first sub-pixels respectively coincide with the two first vertices; and
    wherein centers of the two second sub-pixels respectively coincide with the two second vertices.

3. The pixel arrangement structure according to claim 1, wherein the first virtual quadrilateral is formed as a trapezoid, and the first side and the second side are parallel to each other.

4. The pixel arrangement structure according to claim 1, wherein in the first virtual quadrilateral, a distance between one of the two first sub-pixels and any adjacent second sub-pixel is not equal to a distance between the other one of the two first sub-pixels and any adjacent second sub-pixel.

5. The pixel arrangement structure according to claim 1, wherein one of two opposite inner angles of the first virtual quadrilateral is smaller than 90°, and the other one of the two opposite inner angles of the first virtual quadrilateral is greater than 90°.

6. The pixel arrangement structure according to claim 1, wherein in the first virtual quadrilateral, a distance between the center of the third sub-pixel and a center of any first sub-pixel is not equal to a distance between the center of the third sub-pixel and a center of any second sub-pixel.

7. The pixel arrangement structure according to claim 1, comprising:

a plurality of first virtual quadrilaterals and the plurality of first virtual quadrilaterals are arranged to form an array in a manner of sharing sides.

8. The pixel arrangement structure according to claim 7, wherein in the row direction or the column direction, two first virtual quadrilaterals sharing the first side or the second side forms a group;

wherein two first virtual quadrilaterals sharing the second side or the first side in an adjacent row or an adjacent column forms another group;

wherein in two groups of first virtual quadrilaterals, four first virtual quadrilaterals share one of the first vertices or one of the second vertices, and lines connecting centers of the four third sub-pixels form a second virtual quadrilateral; and wherein in the column direction or the row direction, the second virtual quadrilateral comprises a third side and a fourth side facing to each other and unequal in length.

9. The pixel arrangement structure according to claim 8, wherein the third side and the fourth side are parallel to each other.

10. The pixel arrangement structure according to claim 8, wherein the second virtual quadrilateral is formed as a trapezoid, and the third sub-pixel has a shape of rectangle or quasi-rectangle.

11. The pixel arrangement structure according to claim 10, wherein a length direction of the third sub-pixel forms an inclination angle with respect to the row direction or the column direction.

12. The pixel arrangement structure according to claim 11, wherein the inclination angle ranges from 45° to 135°.

13. The pixel arrangement structure according to claim 11, wherein in the row direction or the column direction, a minimum distance between a virtual side of any third sub-pixel and a virtual side of an adjacent third sub-pixel is a first distance;

wherein in the column direction or the row direction, a minimum distance between the virtual side of the any third sub-pixel and a virtual side of another adjacent third sub-pixel is a second distance; and wherein the first distance is smaller than the second distance.

14. The pixel arrangement structure according to claim 8, wherein two third sub-pixels of the two first virtual quadrilaterals sharing the second side share a mask aperture.

15. The pixel arrangement structure according to claim 1, wherein an aperture area of any one of the two second sub-pixels is greater than an aperture area of any one of the two first sub-pixels and greater than an aperture area of the third sub-pixel.

16. The pixel arrangement structure according to claim 15, wherein a distance between the center of the third sub-pixel and a center of any first sub-pixel is smaller than a distance between the center of the third sub-pixel and a center of any second sub-pixel.

17. The pixel arrangement structure according to claim 15, wherein the first sub-pixel is a red sub-pixel, the second sub-pixel is a blue sub-pixel, and the third sub-pixel is a green sub-pixel.

18. A display panel, comprising the pixel arrangement structure according to claim 1.

19. A display device, comprising the display panel according to claim 18.

* * * * *